(12) United States Patent
Sun

(10) Patent No.: US 11,287,289 B2
(45) Date of Patent: Mar. 29, 2022

(54) DIGITAL ENCODER WITH SCREEN

(71) Applicant: Jen-Wen Sun, New Taipei (TW)

(72) Inventor: Jen-Wen Sun, New Taipei (TW)

( * ) Notice: Subject to any disclaimer, the term of this patent is extended or adjusted under 35 U.S.C. 154(b) by 368 days.

(21) Appl. No.: 16/516,275

(22) Filed: Jul. 19, 2019

(65) Prior Publication Data

US 2021/0018342 A1   Jan. 21, 2021

(51) Int. Cl.
*G01D 5/347* (2006.01)
*G06F 3/03* (2006.01)
*H05K 5/02* (2006.01)
*H05K 5/00* (2006.01)
*G06F 3/0362* (2013.01)
*G06F 3/02* (2006.01)

(52) U.S. Cl.
CPC ....... *G01D 5/34715* (2013.01); *G01D 5/3473* (2013.01); *G06F 3/02* (2013.01); *G06F 3/0312* (2013.01); *G06F 3/0362* (2013.01); *H05K 5/0017* (2013.01); *H05K 5/0217* (2013.01)

(58) Field of Classification Search
CPC .. G01D 5/34715; G01D 5/3473; G01D 5/347; G01D 5/34707; G01D 5/32; G01D 5/34; G01D 5/342; G06F 3/02; G06F 3/03; G06F 3/0304; G06F 3/0312; G06F 3/0362; G06F 3/033; H05K 5/0017; H05K 5/0217; H05K 5/02
See application file for complete search history.

(56) References Cited

U.S. PATENT DOCUMENTS

| | | | | |
|---|---|---|---|---|
| 5,712,661 A | * | 1/1998 | Jaeger | G02F 1/13306 345/170 |
| 8,094,517 B2 | * | 1/2012 | Arney | G01S 15/96 367/109 |
| 8,198,555 B2 | * | 6/2012 | Baker | H01H 25/041 200/5 A |
| 8,304,673 B2 | * | 11/2012 | Sun | H01H 13/83 200/314 |
| 9,728,355 B2 | * | 8/2017 | Chu | H01H 19/115 |
| 10,635,214 B1 | * | 4/2020 | Sun | G06F 3/0202 |
| 10,753,619 B2 | * | 8/2020 | Yang | H01H 25/065 |
| 2009/0115748 A1 | * | 5/2009 | Tanaka | G06F 3/0338 345/184 |
| 2010/0163386 A1 | * | 7/2010 | Sun | A61P 3/04 200/341 |
| 2010/0213038 A1 | * | 8/2010 | Sun | H01H 9/181 200/61.1 |
| 2011/0127149 A1 | * | 6/2011 | Sun | H01H 13/83 200/314 |
| 2019/0113985 A1 | * | 4/2019 | Sawada | G06F 3/0317 |

(Continued)

*Primary Examiner* — John R Lee

(57) ABSTRACT

A digital encoder with a screen includes a key body, and a display assembly is configured inside the key body. The display assembly includes a display carrier assembly, display element configured on the display carrier assembly and display circuit element configured in the display carrier assembly, where one side of the display assembly is in connection with a rotating assembly movably configured on a carrier housing, and a rotary encoder sensor and pressing element are configured between the rotating assembly and carrier housing, thereby allowing the assembly of the key body to be more convenient through modulization structures, and allowing the key body to have multiple functions of display, press and rotation at the same time to increase use convenience.

9 Claims, 12 Drawing Sheets

(56) References Cited

U.S. PATENT DOCUMENTS

| | | | |
|---|---|---|---|
| 2019/0170362 A1* | 6/2019 | Morton | A47J 37/0842 |
| 2019/0189368 A1* | 6/2019 | Yu | H01H 19/025 |
| 2019/0204983 A1* | 7/2019 | Huner | G06F 3/04847 |
| 2019/0220173 A1* | 7/2019 | Zuehlke | B60K 37/06 |
| 2019/0223305 A1* | 7/2019 | Hsieh | H04R 1/021 |
| 2020/0110492 A1* | 4/2020 | Sun | H03K 17/96 |
| 2021/0018342 A1* | 1/2021 | Sun | G01D 13/00 |

* cited by examiner

DIGITAL ENCODER WITH SCREEN

TECHNICAL FIELD OF THE INVENTION

The present invention relates to a digital encoder with a screen, which has multiple use functions.

DESCRIPTION OF THE PRIOR ART

The so-called key or button is designed to push the keycap by a pressing action, thereby driving the internal circuit to generate a signal to a connected electronic device, thereby achieving a control effect. But a general key has only a single function. That is, it is only possible to transmit control signals by pressing. If the functions of use of the key want to be increased, it will be quite troublesome and easy to make the overall structure quite complicated, and therefore, most of the keys have only one single function: pressing.

SUMMARY OF THE INVENTION

The main object of the present invention is to provide a digital encoder with a screen, allowing a key to have multiple use functions besides a pressing effect.

To achieve the above object, the present invention proposes a digital encoder with a screen, including a key body, display assembly configured in the key body, rotating assembly configured at one side of the display assembly and in connection with the display assembly, carrier housing configured inside the key body and allowing the rotating assembly to be movably configured thereon, rotary encoder sensor configured on the carrier housing and positioned between the rotating assembly and carrier housing, and pressing element configured between the carrier housing and rotary encoder sensor, where the display assembly includes a display element, display carrier assembly and display circuit element, where the display element is configured on the display carrier assembly, and the display circuit element is configured in the display carrier assembly and in electric connection with the display element for information transmission.

With the above structures, the display assembly, rotating assembly, rotary encoder sensor and pressing element are assembled on the carrier housing in sequence from top to bottom, and the key body can then be constituted by means of modulization and the key body can be in connection with a required electronic device for control. The rotating assembly and rotary encoder sensor can be driven to push the pressing element to achieve a pressing effect or to rotate the rotating assembly after the display assembly is pressed down, thereby sensing the rotating angle of the rotating angle of the rotating assembly through the rotary encoder sensor and transmitting a rotating signal to the electronic device, and whether the result of the press or the result of the rotation is displayed on the display element in the display assembly so that the key body can have multiple functions at the same time.

DETAILED DESCRIPTION OF THE PREFERRED EMBODIMENTS

Figure 1:
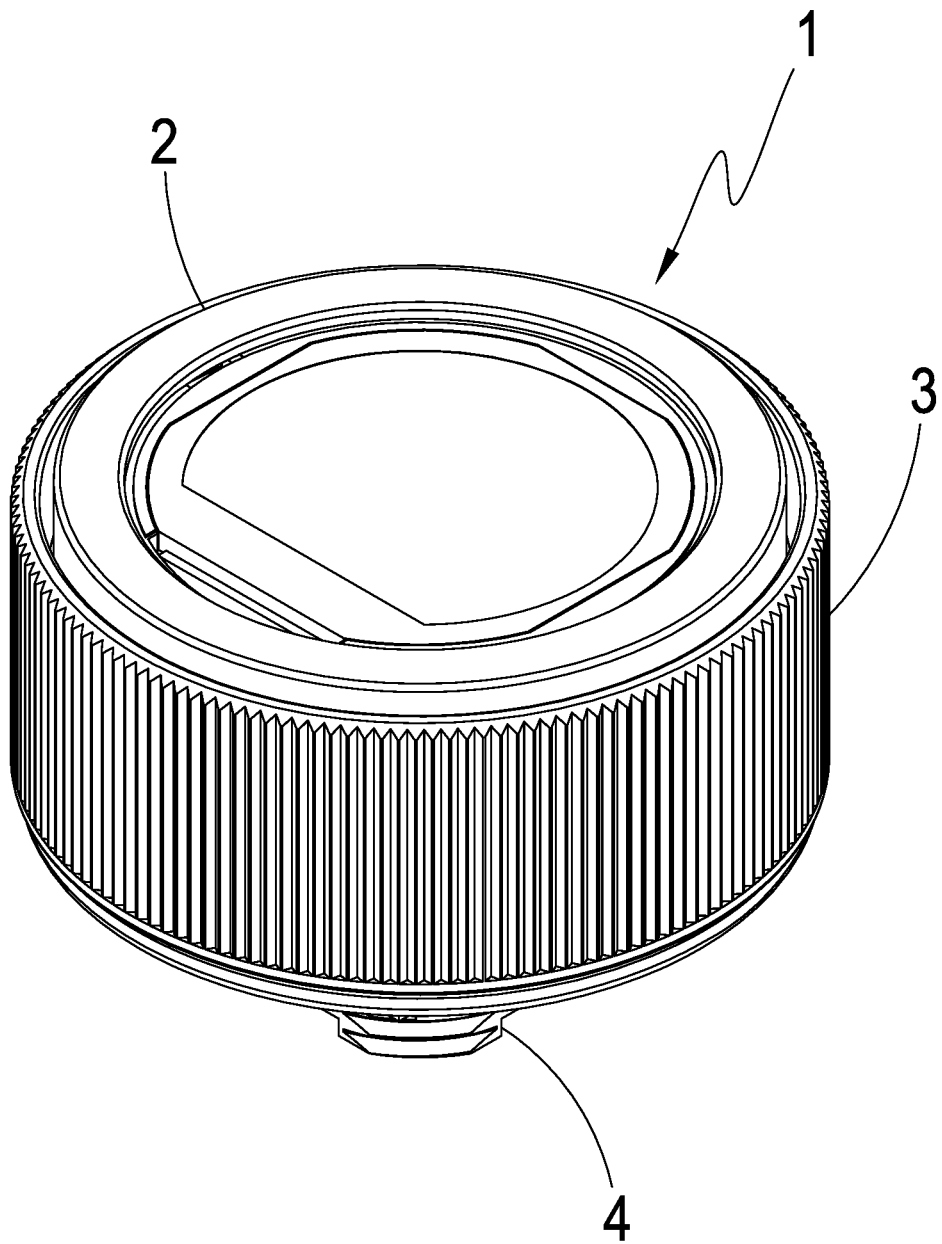
FIG. 1 is a perspective view of a preferred embodiment of the present invention.
Figure 2:
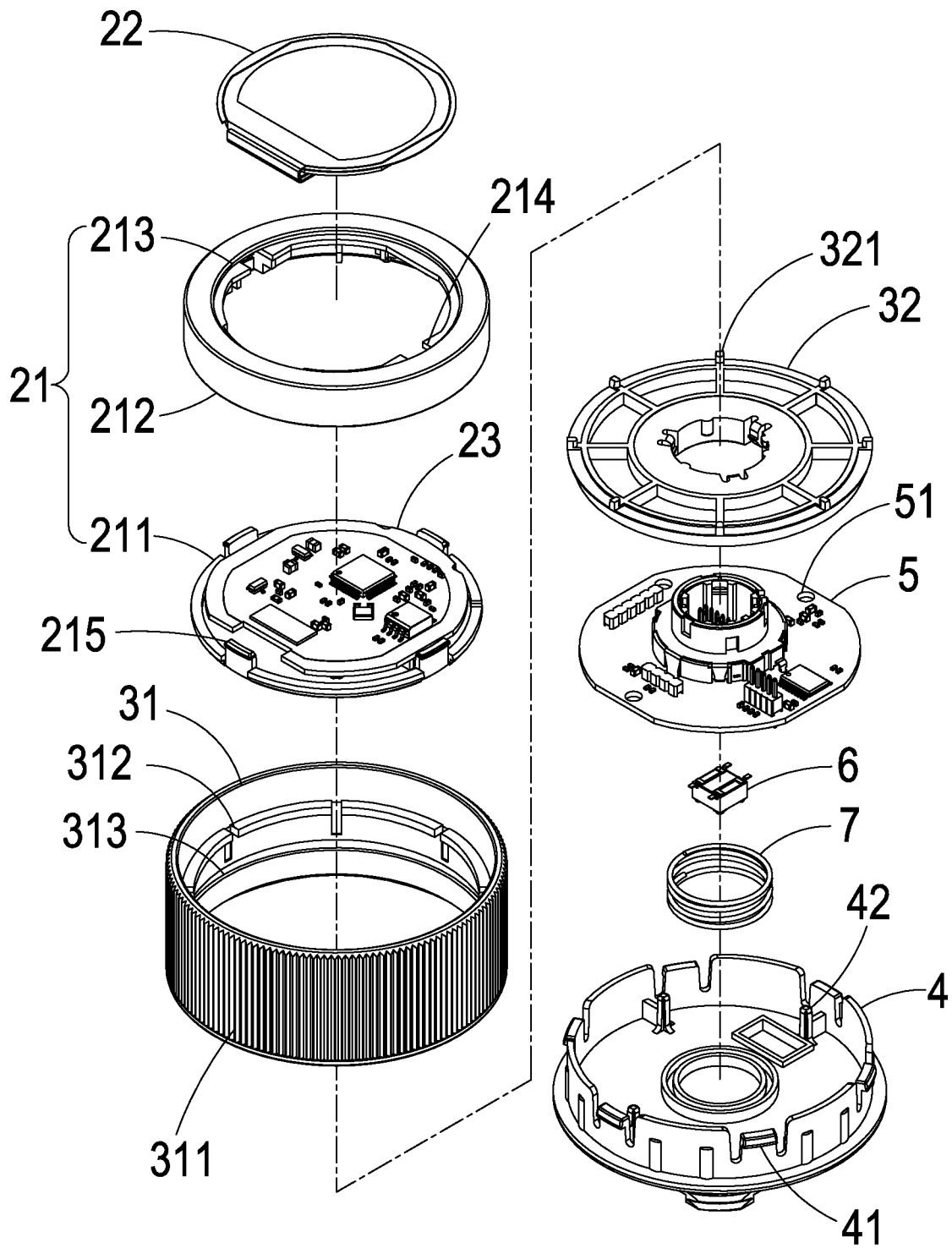
FIG. 2 is an exploded view of the embodiment of the present invention.
Figure 3:
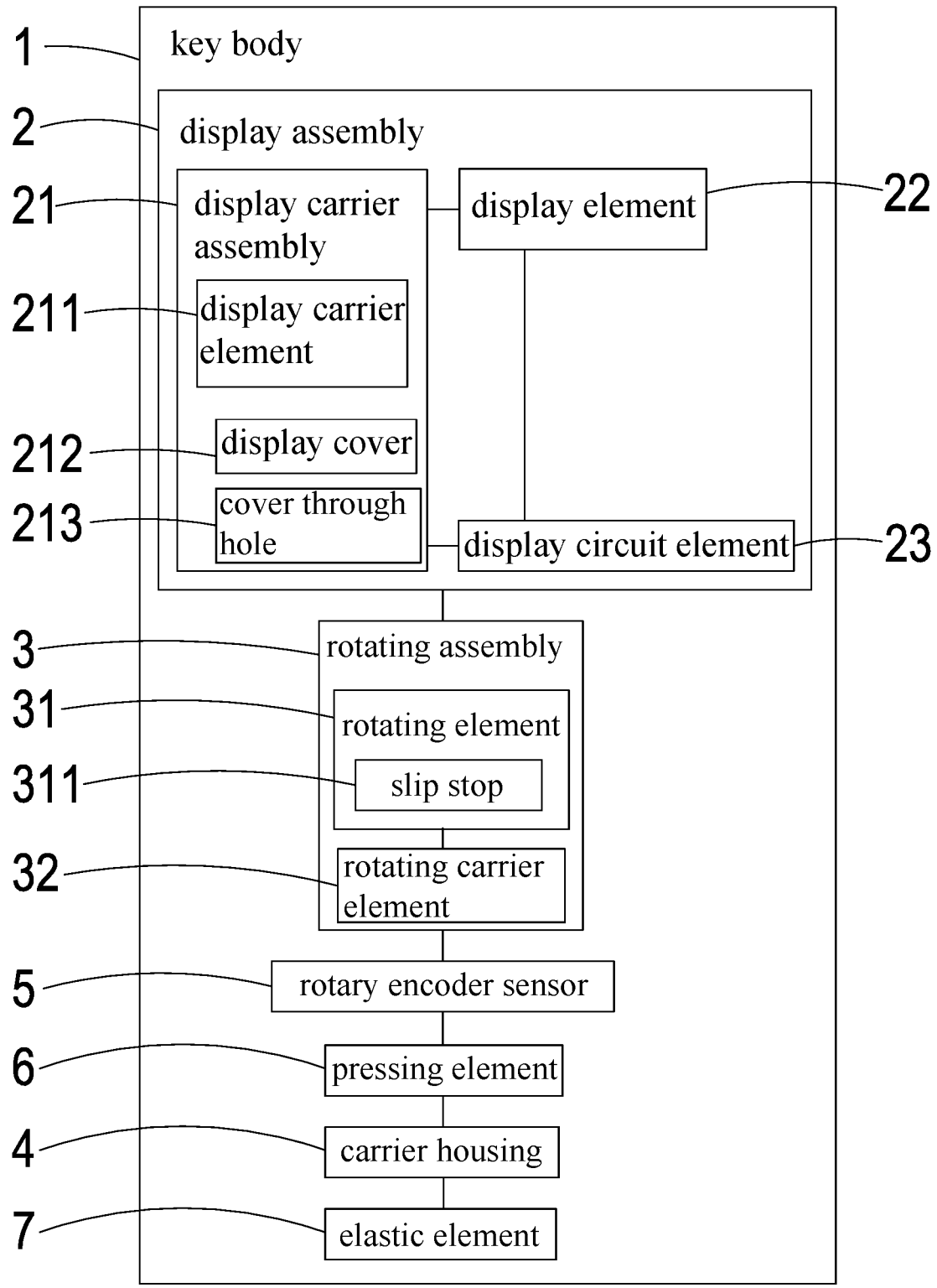
FIG. 3 is a block diagram of a structure of the embodiment of the present invention.
Figure 4:
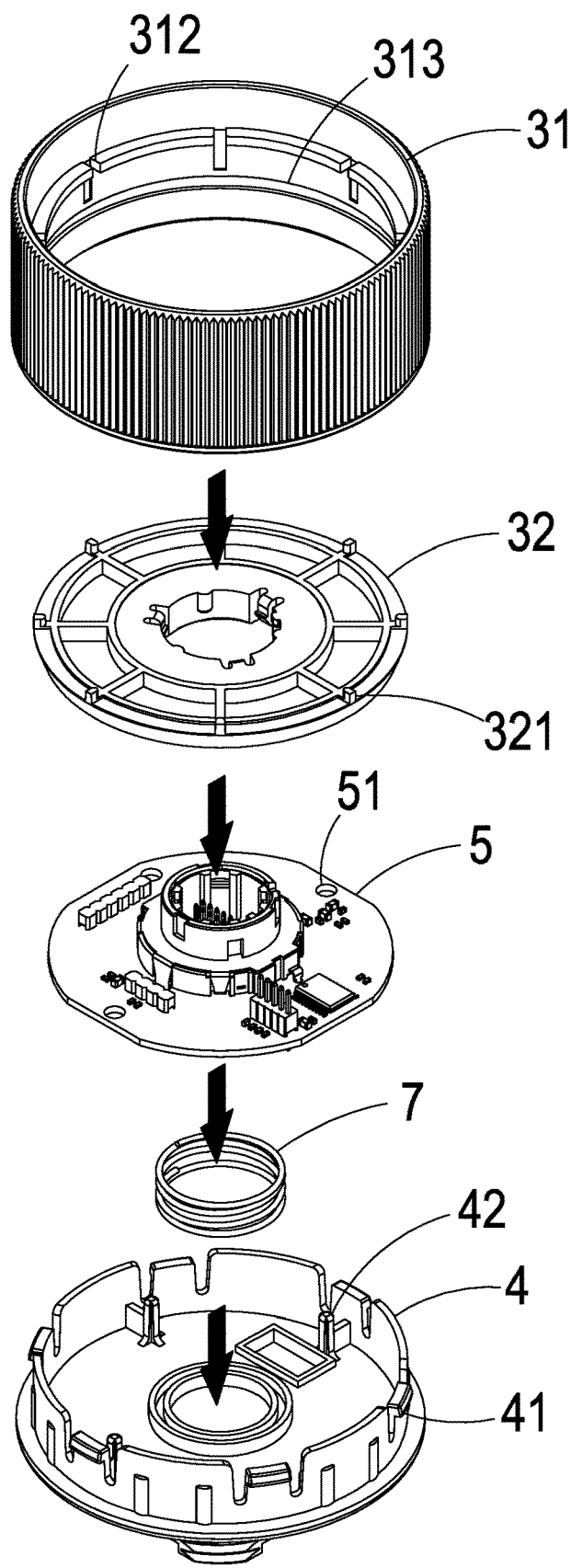
FIGS. 4 and 5 respectively show the assembly of the embodiment of the present invention.
Figure 5:
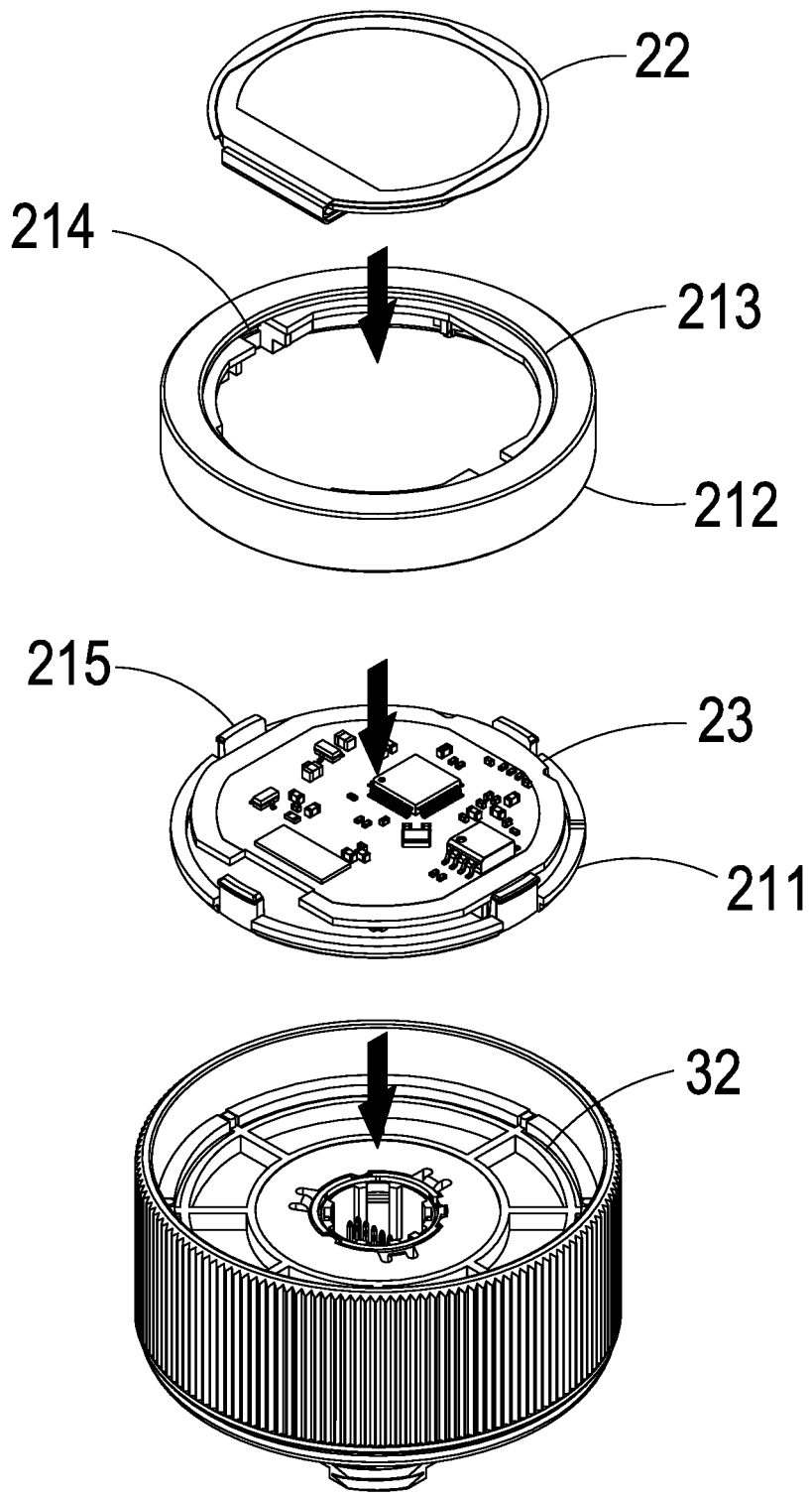

Referring to FIGS. 1 to 3, a digital encoder with a screen of the present invention includes a key body 1, display assembly 2, rotating assembly 3, carrier housing 4, rotary encoder sensor 5, pressing element 6 and elastic element 7.

The display assembly 2 is configured in the key body 1 and includes a display carrier assembly 21, display element 22 configured on the display carrier assembly 21 and display circuit element 23 configured in the display carrier assembly 21 and in electric connection with the display element 22, where the display carrier assembly 21 has a display carrier element 211, display cover 212 configured on the display carrier element 211 and cover through hole 213 formed on the display cover 212, and the display element 22 is positioned at the cover through hole 213. In a preferred embodiment, the display element 22 is an LED display screen, the display circuit element 23 is a control circuit board adapted to control the display element 22, and the display carrier assembly is a housing adapted to accommodate the display element 22 and display circuit element 23. Furthermore, the display cover 212 has a groove 214 adapted to be in engagement with the display carrier element 211, and the display carrier element 211 has a plurality of elastic tenons adapted to be in engagement with the groove 214.

The rotating assembly 3 is configured at one side of the display assembly 2 and includes a rotating element 31 and a rotating carrier element 32 configured inside the rotating element 31. In the embodiment, the inside of the rotating element 3 has a plurality of concave portions 312, and the rotating carrier element 32 has a plurality of convex blocks 321 corresponding to the plurality of concave portions 312, thereby allowing the rotating carrier element 32 to be in engagement with the rotating element 31 by inserting the plurality of convex blocks 321 in the plurality of corresponding concave portions 312.

A plurality of slip stops 311 are configured on the rotating element 31. In the embodiment, the slip stop 311 is a rib formed on the rotating element 31.

The carrier housing 4 is configured inside the key body 1. In the embodiment, the carrier housing 4 is a plastic shell allowing the rotating assembly 3 to be movably configured thereon; an annular groove 313 is formed inside the rotating element 31, and a plurality of housing tenons capable of correspondingly in engagement with the annular groove 313 are configured on the carrier housing 4, thereby allowing the rotating element 31 to be rotated relatively to the rotating element 31.

The rotary encoder sensor 5 is movably configured on the carrier housing 4, and positioned at one side of the rotating assembly 3, capable using mechanical method to sense the rotating angle of the rotating assembly 3. In the embodiment, the rotary encoder sensor 5 has a plurality of through holes 51, and the carrier housing 4 has a plurality of guide rods 42 corresponding to the plurality of through holes 51, thereby allowing the rotary encoder sensor 5 to be placed into the carrier housing 4 by aligning each through hole 51 to the corresponding guide rod 42 so as to be movably configured inside the carrier housing 4.

The pressing element 6 is configured between the rotary encoder sensor 5 and carrier housing 4. In the embodiment, the pressing element 6 is a switch.

The elastic element 7 is configured at one side of the pressing element 6, and the two ends of the elastic element 7 will be respectively pressed against the carrier housing 4 and rotary encoder sensor 5, where the elastic element 7 is a spring that can assist the springback of the pressing element 6.

With the corresponding coordination of this structure, the key body 1 has multiple use functions, and the detailed explanation will be given thereinafter.

Referring to FIGS. 1 to 8, upon assembly, the pressing element 6 is first in connection with the rotary encoder sensor 5; the connection way in the embodiment is taking engagement (matching) as an example. Thereafter, the elastic element 7 is put around the pressing element 6, and the rotary encoder sensor 5 is placed into the carrier housing 4 after the through holes 51 of the rotary encoder sensor 5 are aligned with the corresponding guide rods 42 of the carrier housing 4. Next, the rotating carrier element 32 is in engagement with the rotating element 31 by matching the convex blocks with the concave portions 312, and the housing tenons 41 of the carrier housing 4 is in corresponding engagement with the annular groove 313 of the rotating element 31. Thus, the housing tenons 41 can be slidably limited to the annular groove 31, thereby allowing the rotating assembly 3 to be rotatable on the carrier housing 4.

Thereafter, the display circuit element 23 is placed on the display carrier element 211 of the display carrier assembly 21. At the same time, the display element 22 is in electric connection with the display circuit element 23 for information transmission, and the display cover 212 is further covered on and the elastic tenons 215 are in engagement with the grooves 214 to fix the display cover 212 to the display carrier element 211, thereby being assembled into the display assembly 2. In addition, the display element 22 will be positioned at the cover through hole 213, a user can then be allowed to observe the content displayed on the display element 22 through the cover through hole 213. Finally, the display assembly 2 is assembled on the rotating carrier element 32 so as to constitute the key body 1. Upon the assembly, both the display assembly 2 and rotating assembly 3 may be assembled by means of modularization so that the assembly can still be more convenient and faster. The above assemblies and fixations are all by means of engagement (matching), but the present invention is not so limited.

Figure 6:
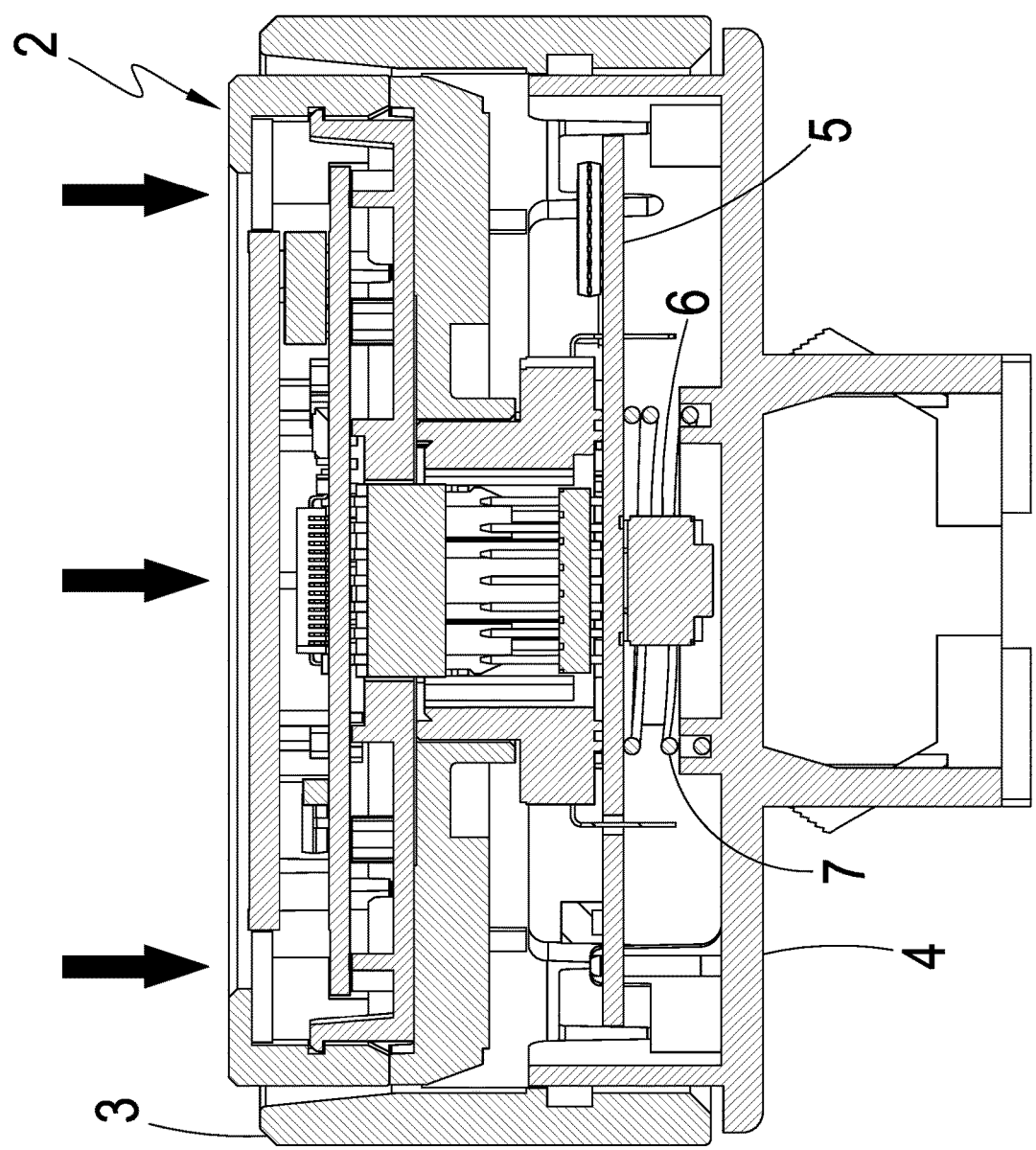
FIG. 6 is a cross-sectional view of the embodiment of the present invention upon pressing.

Upon use, a user can use the various functions of the key body to have a variety of uses. The display assembly 2 is pressed down, as FIG. 6 shows, the rotating carrier element 32 and rotary encoder sensor 5 will be driven to rotate, thereby pushing the pressing element 6 to press against the carrier housing 4, and a pressing signal can then be generated by the pressing element 6, allowing the key body 1 to have a pressing effect. Furthermore, the elastic element 7 can assist the entire action during the pressing and increase the force of the springback, allowing the pressing to be smoother and increasing the feedback of the use's pressing.

Figure 7:
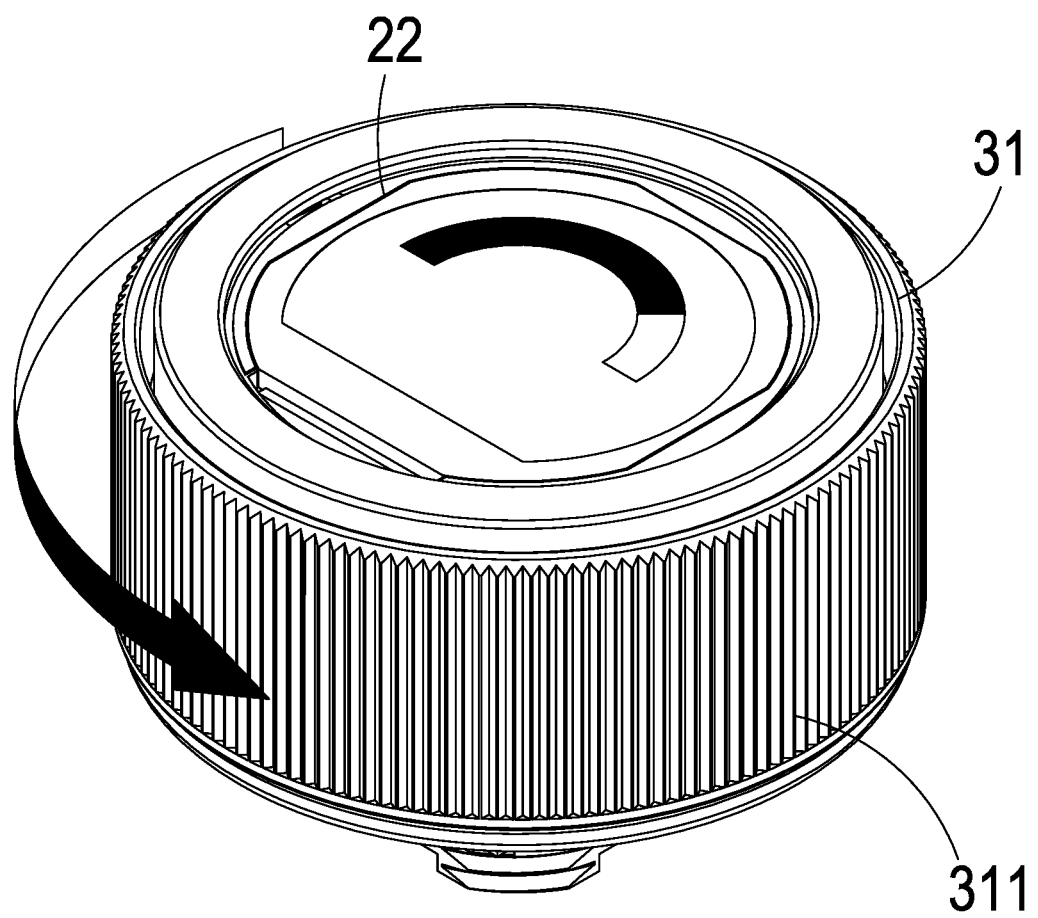
FIGS. 7 and 8 respectively show the embodiment of the present invention upon rotation.
Figure 8:
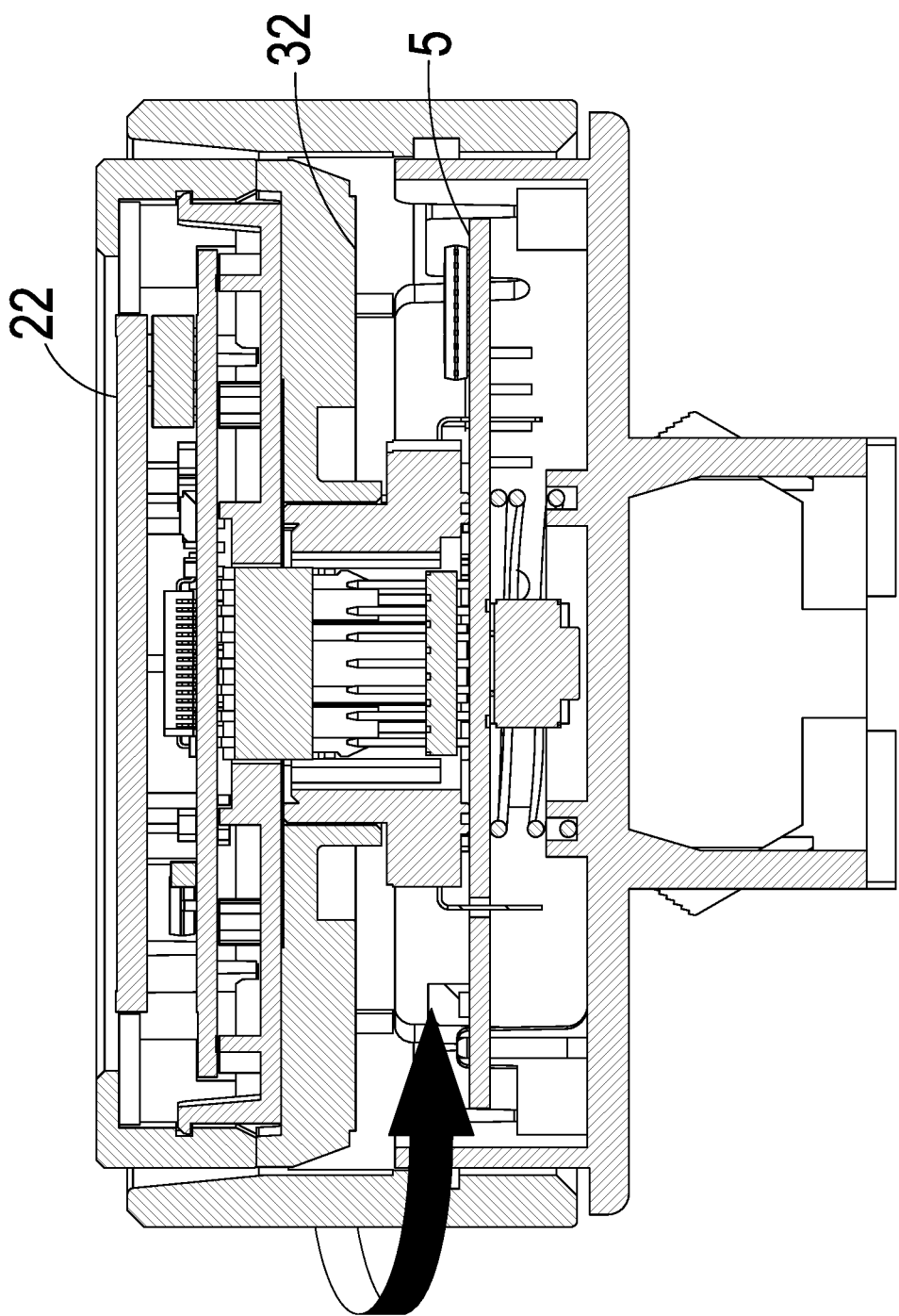
Figure 9:
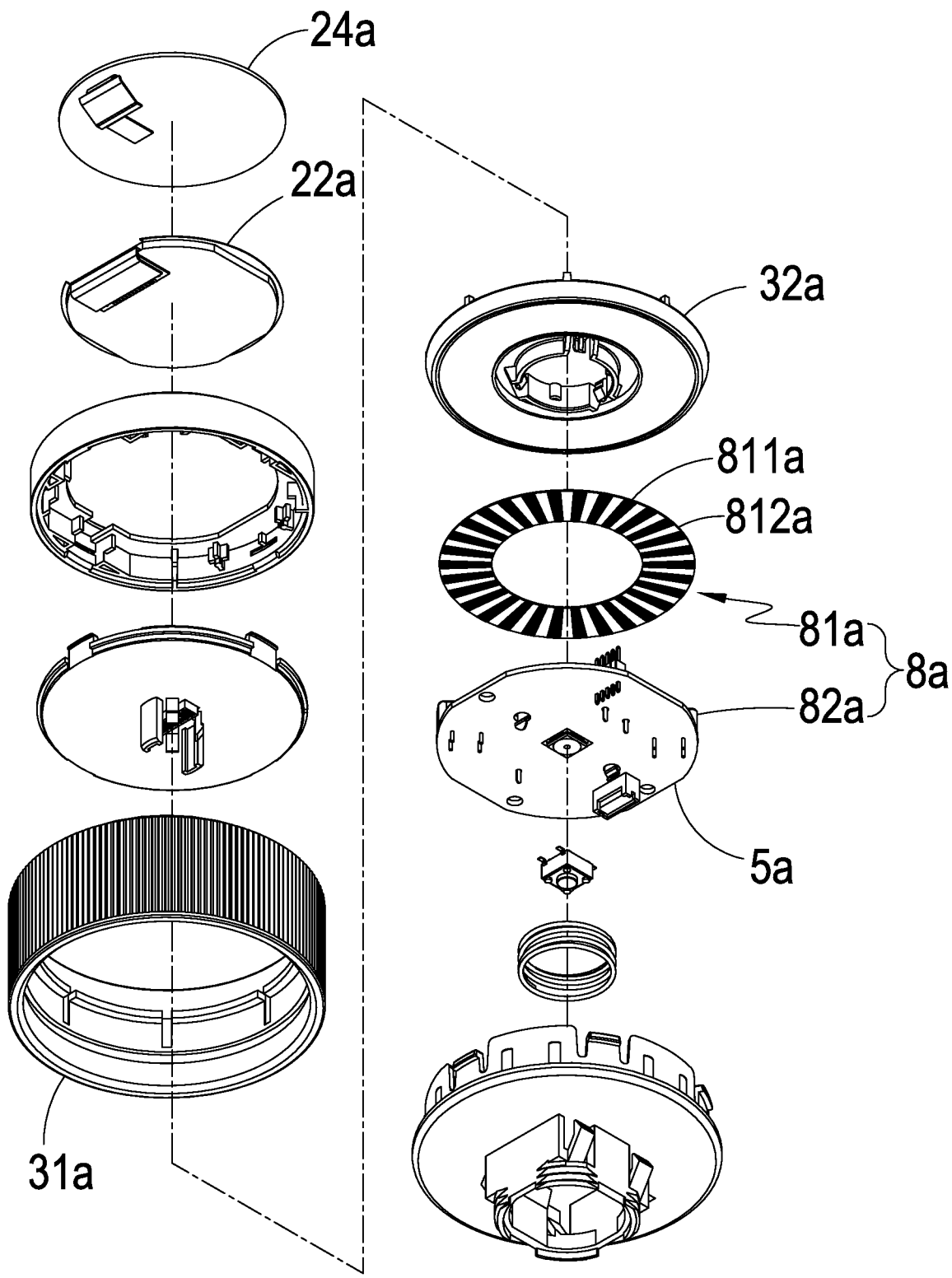
FIG. 9 is an exploded view of another preferred embodiment of the present invention.
Figure 10:
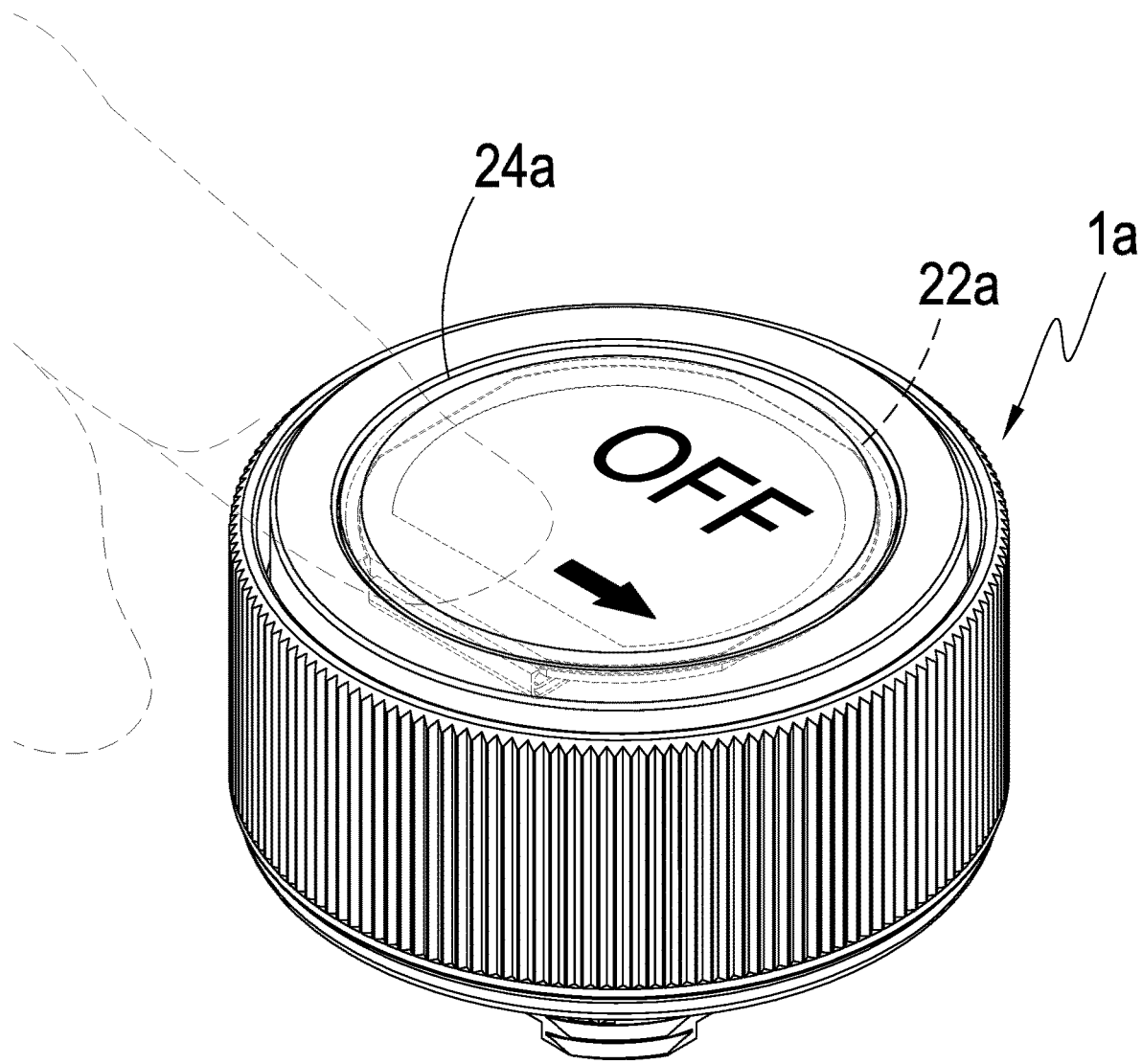
FIG. 10 shows the embodiment of the present invention upon sliding.
Figure 11:
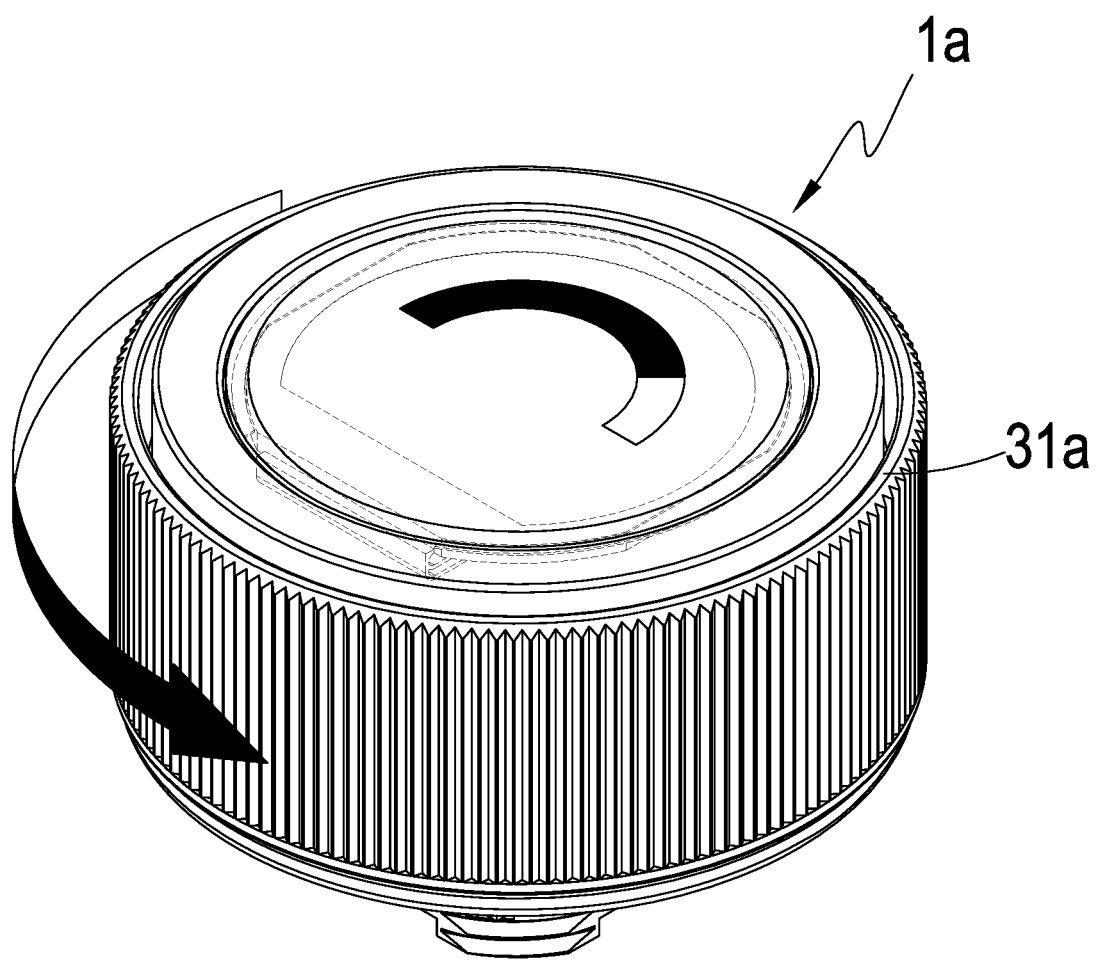
FIGS. 11 and 12 respectively show the embodiment of the present invention upon rotation.
Figure 12:
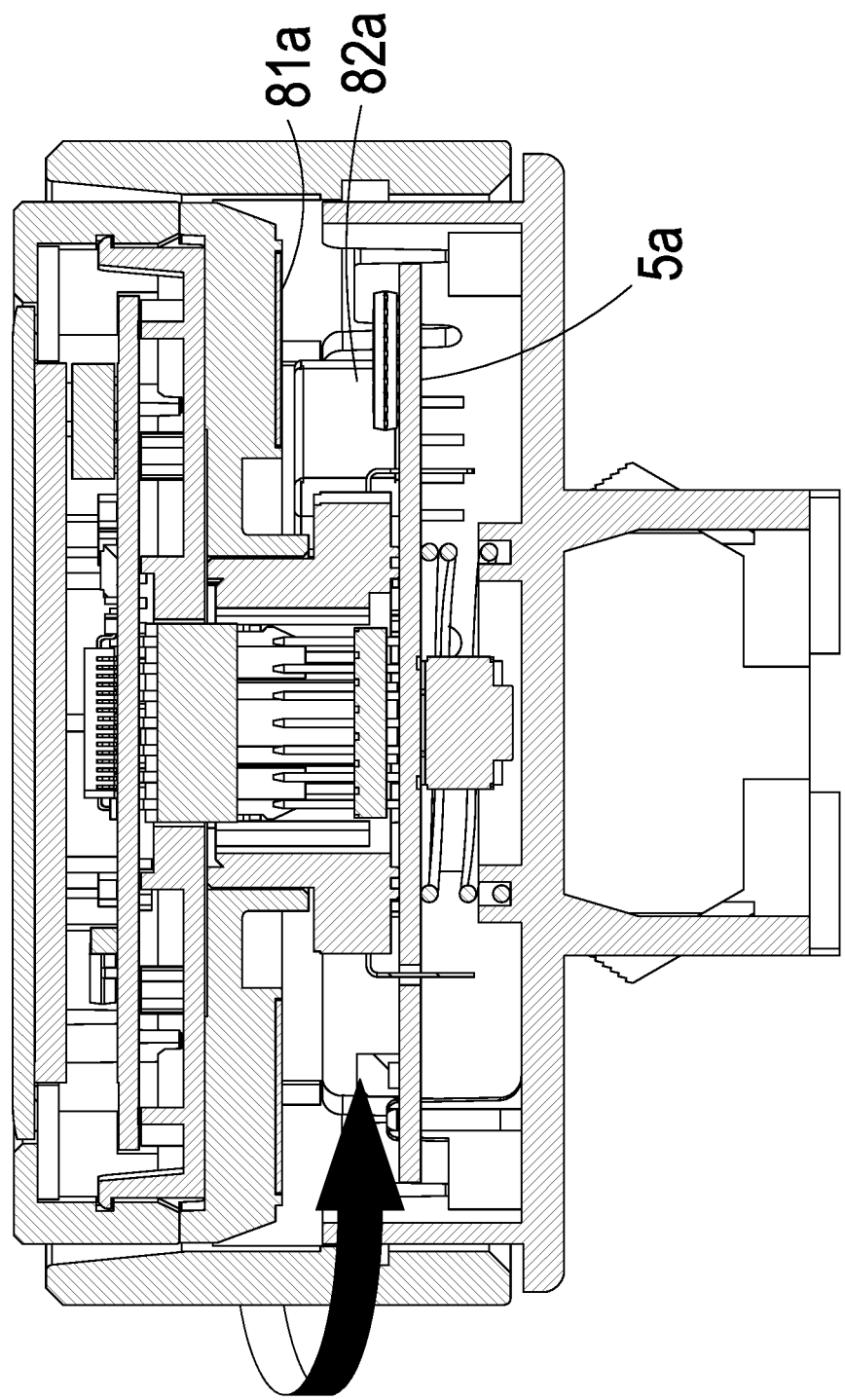

Referring to FIGS. 2, 7 and 8, since the housing tenons 41 of the carrier element 4 are slidably limited in the annular groove 313 of the rotating groove 313, a user can rotate the rotating element 31 to cause the housing tenons 41 to be slid inside the annular groove 313 to drive the rotating wilier element 32 to rotate. Upon the rotation, the user may touch the slip stop 311, allowing the rotating effect to be more completely transferred, when the rotating assembly 3 is rotated, the rotary encoder sensor 5 will then sense the rotating angle of the rotating carrier element 32, and a rotating signal can then be generated to achieve a rotation adjustment function, for example, sound volume adjustment. In the embodiment, the rotary encoder sensor 5 is similar to a mechanical encoder, and the detailed structure and sensing way thereof are thus omitted here. Furthermore, the signals will be transmitted to the display element 22 to allow the user to observe the condition of use on the display element 22 during the above pressing and rotation.

Referring to FIGS. 9 to 12, illustrating another preferred embodiment of the present invention, the present embodiment is almost similar to the above embodiment except the display element 22a has a touch control element 24a in the present embodiment; the touch control element 24a is fixed to the touch control panel on the display element 22a, where the fixation way is taking engagement (matching) as an example in the present embodiment, and the key body 1a is allowed to further have touch control function. Furthermore, the display element 22a is allowed to display the word "OFF" by means of sliding so as to transmitted a "close" signal to a required electronic device, and this means that the key body la has the function of touch control or not.

Furthermore, the rotary encoder sensor 5a is configured with a light sensing assembly 8a including a reflector 81a configured on one side of the rotating carrier element 32a adjacent to the rotary encoder sensor 5a and a plurality of optical sensing elements 82a configured on the rotary encoder sensor 5a, where the optical sensing element 82a is an infrared sensor that can emit infrared rays and receive rebounded infrared rays, and the reflector 81ahas a plurality of reflecting portions 811a and a plurality of non-reflecting portions 812a arranged alternatively. in the embodiment, the reflecting element 81a is a sticker attached to the rotating carrier element 32a, with one face thereof having black reflecting portions 811a and white non-reflecting portions 812a spaced in-between being adjacent to the rotary encoder sensor 5a. Thus, the infrared ray emitted from the optical sensing element 82a will be rebounded back to the optical sensing element 82a when projected to the reflecting portion 811a, and will not be rebounded back if projected to the non-reflecting portion 812a. Therefore, when the rotating element 31a is rotated to drive the rotating carrier element 32a to rotate, the signal received by the optical sensing element 82a will be continuously changed, and the rotating angle of the rotating carrier element 31a can then be inferred so that the accuracy of the rotating angle sensed can be strengthened with the rotary encoder sensor 5a.

I claim:
1. A digital encoder with a screen, comprising:
a key body which includes a display assembly and a rotating assembly;
the display assembly, configured in said key body and comprising a display element, display carrier assembly and display circuit element, said display element configured on said display carrier assembly, and said display circuit element in said display carrier assembly and in electric connection with said display element for information transmission;

the rotating assembly, configured at one side of said display assembly, and said display assembly in connection with said rotating assembly;
a carrier housing, configured inside said key body, and said rotating assembly movably configured on said carrier housing;
a rotary encoder sensor, movably configured on said carrier housing and positioned between said rotating assembly and carrier housing, and said rotary encoder sensor adapted to sense a rotating action of said rotating assembly; and
a pressing element, configured between said carrier housing and rotary encoder sensor and in connection with said rotary encoder sensor.

2. The digital encoder according to claim 1, wherein said display carrier assembly has a display cover, cover through hole and display carrier element, said cover through hole is formed on said display cover, and said display cover is configured on said display carrier element and said display element at said cover through hole.

3. The digital encoder according to claim 1, wherein said rotating assembly has a rotating element and a rotating carrier element configured inside said rotating element.

4. The digital encoder according to claim 3, wherein said rotating element has at least one slip stop.

5. The digital encoder according to claim 1, wherein said rotary encoder sensor is configured with a light sensing assembly adapted to sense said rotating action of said rotating assembly by means of optical sensing.

6. The digital encoder according to claim 5, wherein said light sensing element comprises a reflecting element and at least one optical sensing element, said optical sensing element is configured on said rotary encoder sensor, and said reflecting element said rotating assembly and positioned correspondingly to said optical sensing element.

7. The digital encoder according to claim 6, wherein said reflecting element has a plurality of reflecting portions and a plurality of non-reflecting portions arranged alternatively.

8. The digital encoder according to claim 1, wherein one side of said pressing element is configured with an elastic element, and two ends of said elastic element are respectively pressed against said carrier housing and rotary encoder sensor.

9. The digital encoder according to claim 1, wherein said display assembly has a touch control element, and said touch control element is in electric connection with said display circuit element for information transmission.

* * * * *